(12) United States Patent
van Bilsen

(10) Patent No.: US 6,666,924 B1
(45) Date of Patent: Dec. 23, 2003

(54) REACTION CHAMBER WITH DECREASED WALL DEPOSITION

(75) Inventor: Franciscus B. van Bilsen, Bertem (BE)

(73) Assignee: ASM America, Phoenix, AZ (US)

( * ) Notice: Subject to any disclaimer, the term of this patent is extended or adjusted under 35 U.S.C. 154(b) by 0 days.

(21) Appl. No.: 09/537,596

(22) Filed: Mar. 28, 2000

(51) Int. Cl.$^7$ .............................................. C23C 16/00
(52) U.S. Cl. .................. 118/724; 118/715; 156/345.37; 427/248.1
(58) Field of Search ................. 118/715, 724; 156/345, 345.37; 427/248.1

(56) References Cited

U.S. PATENT DOCUMENTS

| | | | | |
|---|---|---|---|---|
| 3,665,139 A | * | 5/1972 | Steggewentz | 219/618 |
| 3,862,397 A | | 1/1975 | Anderson et al. | 219/405 |
| 3,900,597 A | | 8/1975 | Chruma et al. | 427/82 |
| 4,201,152 A | | 5/1980 | Luscher | 118/712 |
| 4,284,867 A | | 8/1981 | Hill et al. | 219/10.49 R |

(List continued on next page.)

OTHER PUBLICATIONS

Chemical Compositions [online], [retrieved on Oct. 8, 1999]. Retrieved from GE Quartz website using Internet <URL: http:www.gespectrum.com/inet/quartz/chemical.htm>.

Optical Properties [online], [retrieved on Oct. 8, 1999]. Retrieved from GE Quartz website using Internet<URL: http:www.gespectrum.com/inet/quartz/optical.htm>.

GE Quartz– Optical Properties [online], [retrieved on Mar. 27, 2000]. Retrieved from GE Quartz website using Internet <URL: http:www.gespectrum.com/inet/quartz/english/optical.htm>.

*Primary Examiner*—Jeffrie R. Lund
(74) *Attorney, Agent, or Firm*—Greenlee, Winner & Sullivan, PC

(57) ABSTRACT

An apparatus for processing substrates comprising a process chamber having walls, wherein one or more selected regions of the walls are different temperatures than other regions of said walls during processing of substrates, whereby the chamber has reduced deposition of byproducts from processing is provided. Methods of minimizing deposition on a reaction chamber having walls comprising altering the temperature of selected regions of the walls are also provided.

10 Claims, 5 Drawing Sheets

U.S. PATENT DOCUMENTS

| | | | | |
|---|---|---|---|---|
| 4,496,609 A | | 1/1985 | McNeily et al. | 427/55 |
| 4,579,080 A | * | 4/1986 | Martin et al. | 118/500 |
| 4,641,603 A | | 2/1987 | Miyazaki et al. | 118/724 |
| 4,653,428 A | | 3/1987 | Wilson et al. | 118/725 |
| 4,654,509 A | * | 3/1987 | Robinson et al. | 219/405 |
| 4,745,088 A | | 5/1988 | Inoue et al. | 437/102 |
| 4,747,368 A | | 5/1988 | Brien et al. | 118/715 |
| 4,760,244 A | | 7/1988 | Hokynar | 219/390 |
| 4,794,217 A | | 12/1988 | Quan et al. | 437/247 |
| 4,846,102 A | | 7/1989 | Ozias | 118/730 |
| 4,870,245 A | | 9/1989 | Price et al. | 219/121.36 |
| 4,989,540 A | | 2/1991 | Fuse et al. | 118/719 |
| 5,038,711 A | | 8/1991 | Dan et al. | 118/715 |
| 5,053,247 A | | 10/1991 | Moore | 427/55 |
| 5,062,386 A | | 11/1991 | Christensen | 118/725 |
| 5,097,890 A | | 3/1992 | Nakao | 165/39 |
| 5,129,994 A | | 7/1992 | Ebbing et al. | 156/643 |
| 5,179,677 A | | 1/1993 | Anderson et al. | 392/411 |
| 5,194,401 A | | 3/1993 | Adams et al. | 437/173 |
| 5,345,534 A | | 9/1994 | Najm et al. | 392/422 |
| 5,348,587 A | | 9/1994 | Eichman et al. | 118/723 MP |
| 5,353,210 A | * | 10/1994 | Strok et al. | 362/293 |
| 5,374,315 A | | 12/1994 | deBoer et al. | 118/725 |
| 5,433,791 A | * | 7/1995 | Brewer et al. | 118/724 |
| 5,514,246 A | | 5/1996 | Blalock | 156/643.1 |
| 5,578,131 A | | 11/1996 | Ye et al. | 118/723 R |
| 5,584,934 A | | 12/1996 | Lin | 118/724 |
| 5,636,320 A | * | 6/1997 | Yu et al. | 392/416 |
| 5,728,629 A | | 3/1998 | Mizuno et al. | 438/680 |
| 5,755,936 A | | 5/1998 | Raaijmakers | 203/298.11 |
| 5,788,799 A | | 8/1998 | Steger et al. | 156/345 |
| 5,824,365 A | | 10/1998 | Sandhu et al. | 427/239 |
| 5,849,092 A | | 12/1998 | Xi et al. | 134/1.1 |
| 5,851,307 A | | 12/1998 | Gilmer et al. | 134/22.1 |
| 5,855,677 A | | 1/1999 | Carlson et al. | 118/666 |
| 5,861,609 A | | 1/1999 | Kaltenbrunner et al. | 219/390 |
| 5,862,302 A | * | 1/1999 | Okase | 392/416 |
| 5,926,743 A | | 7/1999 | Xi et al. | 438/905 |
| 5,961,850 A | * | 10/1999 | Satou et al. | 219/405 |
| 5,976,900 A | | 11/1999 | Qiao et al. | 438/14 |
| 6,067,931 A | * | 5/2000 | Ghezzo et al. | 118/725 |
| 6,143,079 A | * | 11/2000 | Halpin | 118/715 |

* cited by examiner

REACTION CHAMBER WITH DECREASED WALL DEPOSITION

BACKGROUND OF THE INVENTION

This invention relates generally to semiconductor processing and more specifically to improved deposition chambers for the manufacture of semiconductor materials.

The temperature of the walls of a semiconductor reactor (chamber) during operation of the chamber affects, among other things, the efficiency of the process and the quality of the semiconductor wafers produced In the chemical vapor deposition (CVD) process, the substrate (wafer) is heated in a chamber, activating a chemical reaction which deposits a film of material on the surface of the wafer. The walls of the chamber are ideally kept within a narrow temperature range chosen so that unwanted condensation or deposition does not occur on the walls. If the walls or regions of the walls of the chamber are too cold, byproducts of the reaction may condense on the walls or cool regions of the walls. If the walls or regions of the walls of the chamber are too hot, the CVD process may occur on the walls of the chamber or the warmer regions of the walls, as well as on the substrate. Both the cold condensation and hot deposition result in coating of the chamber. This coating must be removed, preferably after each deposition to prevent the coating from flaking off and forming particles on the wafer which degrades wafer quality. The coating is typically removed by an etching process. The need for extensive etching reduces the throughput of the reaction chamber, increasing manufacturing costs. Therefore, it is desired that the coating of the chamber be minimized.

In other semiconductor manufacturing processes, uniformity of the amount of energy reaching the wafer through the walls is an important feature. In the rapid thermal processing (RTP) process, wafers inside the chamber are heated with an energy source located outside the chamber. In the RTP process, uniform temperature distribution at the wafer is important to form a uniform film of the desired material on the substrate. If portions of the chamber walls absorb more or less energy than other portions, the temperature at the wafer will not be uniform, and a nonuniform film will be formed on the wafer.

Methods to maintain the chamber walls near a desired temperature have been reported. U.S. Pat. No. 5,855,677 (Carlson et al.) reports controlling air flow around a reaction chamber in a CVD process to maintain the temperature of the walls of the reaction chamber near a predefined target temperature. U.S. Pat. No. 5,097,890 (Nakao et al.) discloses external cooling of a vertical reaction tube using cooling fluid surrounding the reaction tube.

U.S. Pat. No. 5,129,994 (Ebbing et al.) describes a method of heating one edge of a viewing window by heating a block of a thermally conductive material such as aluminum in contact with the surface of one edge of the viewing window to decrease deposition of polymeric materials on a section of the viewing window.

U.S. Pat. No. 4,653,428 (Wilson et al.) describes a quartz water filter (quartz surfaces surrounding a layer of water) placed between a cold-wall reaction chamber and incident radiation to isolate the substrate from infrared radiation.

Reflectors have also been used around a heating source to generate a more uniform energy distribution (see, for example, U.S. Pat. No. 5,179,677 (Anderson et al.); U.S. Pat. No. 3,862,397 (Anderson et al.); U.S. Pat. No. 4,284,867 (Hill et al.); U.S. Pat. No. 5,062,386 (Christensen); and U.S. Pat. No. 4,794,217 (Quan et al.)).

Coatings have been applied to the inner surface of the reactor to reportedly prevent deposition of by-products. U.S. Pat. No. 5,578,131 (Ye, et al.) reports the use of a layer of halogenated polymeric material with a low sticking coefficient and a low vapor pressure to reduce buildup of byproduct residue on the walls of the chamber. U.S. Pat. No. 5,824,365 (Sandhu, et al.) reports a layer of an electrically insulative metallic oxide on the inner surface of a chamber which reportedly limits adhesion of byproducts of the CVD process on the chamber.

Most chambers have certain locations that experience a higher buildup of coatings than other locations. Also, most chambers have locations where a nonuniform amount of energy is transmitted through the walls. Such local nonuniformity is controllable by localized temperature control. Known methods that modify the temperature of the reaction chamber walls do not permit localized modification. Therefore, methods of locally altering the amount of energy absorbed or wavelengths transmitted by a quartz reaction chamber are needed. Also, the ability to tailor a reaction chamber where the walls are maintained at a selected temperature or selected wavelengths of light are transmitted is needed.

BRIEF SUMMARY OF THE INVENTION

An apparatus for processing substrates comprising a process chamber having walls, said walls having selected regions wherein the temperature is adjusted, whereby the chamber has reduced deposition of byproducts from processing is provided. In one embodiment of the invention, the amount of energy transmitted through the selected regions is adjusted. The amount of energy transmitted through selected regions may be greater or less than the energy transmitted through other regions. In some selected regions, the amount of energy transmitted through the wall may be less than the energy transmitted through other regions of the reaction chamber, and in other selected regions, the amount of energy transmitted may be more than the energy transmitted through other regions of the reaction chamber. Selected regions have at least one characteristic different from other regions of the walls that causes the energy transmission alteration. For example, the selected regions of the walls may have a different concentration of hydroxyl groups than other regions, or may be coated with a material that causes the selected regions to absorb a different amount of energy than other regions. Alternatively, or in combination, the thickness of selected regions of the walls may be a different thickness than in other regions. The temperature of selected regions of the walls may also be modified by positioning one or more energy absorbing elements near the selected regions of the walls. The energy absorbing elements are made of material which is a better absorber of energy than the walls, so that the energy absorbing elements absorb energy and then reradiate energy which is thereafter absorbed by one or more selected wall regions. Alternatively, or in combination, one or more radiation sources are positioned near the selected regions of the walls. The radiation sources emit radiation that is absorbed by selected regions of the chamber. Alternatively, or in combination, reflecting elements are positioned near the selected regions of the walls to reflect energy onto the selected regions of the wall.

All of the various adjusting methods can be employed independently or in combination.

Also provided are methods of minimizing deposition on the walls of a reaction chamber, comprising altering the temperature of one or more selected regions of the walls, whereby deposition on walls during processing of substrates is minimized. The altering step can comprise any one or more of: changing the concentration of hydroxyl groups in selected regions of the walls; increasing or decreasing the thickness of quartz in the selected regions; coating selected regions of the walls with a material that absorbs a different amount of energy than other regions; positioning one or more energy absorbing elements at selected areas around the reaction chamber; positioning a radiation source near a selected area of the chamber, whereby a desired area of the chamber is heated to a greater extent than other areas of the chamber; or positioning a reflecting element at a selected location around the chamber, whereby energy from the chamber is reflected back onto a selected location of the chamber. The reflecting elements are not positioned around the entire chamber.

Also provided is an apparatus having walls, having one or more selected regions in said walls wherein at least one wavelength transmitted through the selected regions is different than the wavelengths transmitted through other regions. "Wavelength" includes a selected range of wavelengths. Also provided is a method of making an apparatus having one or more selected regions wherein at least one wavelength transmitted through selected regions is different than the wavelengths transmitted through other regions, comprising one or more of altering the thickness of the quartz in the selected regions so that the desired wavelength is transmitted, altering the composition of the walls (for example, altering the concentration of hydroxyl groups in quartz walls) in the selected regions so that the desired wavelength is transmitted, or coating the selected regions with a material that, in combination with the wall material, transmits the desired wavelength.

Using the methods described herein, selected regions of the chamber may be adjusted to transmit a desired amount of energy. Also, using the methods described herein, the temperature of a selected area of the reaction chamber may be adjusted to match a desired temperature. Using the methods described herein, deposition of selected areas of the chamber may be reduced.

The modifications of the present invention may be in selected regions of the reaction chamber comprising a small total area of the chamber, or may be in larger areas of the chamber. The entire chamber may have more than one selected region. Modifications preferably occur in less than the whole of the chamber, and preferably occur in places that have a greater amount of coating formed during the deposition process. It is not essential that the coatings referred to herein comprise a perfect layer.

The energy that the reaction chamber is exposed to to affect the temperature of the walls may be any source of energy known in the art, including, but not limited to, radiant energy, plasma, and RF fields. The energy may include wavelengths in the range from low ultraviolet to high infrared. Tungsten lamps are preferred for CVD devices.

Other embodiments of the methods and apparatus of this invention and their applications to substrate processing will become apparent from the following figures and description.

DETAILED DESCRIPTION OF THE INVENTION

Figure 1:
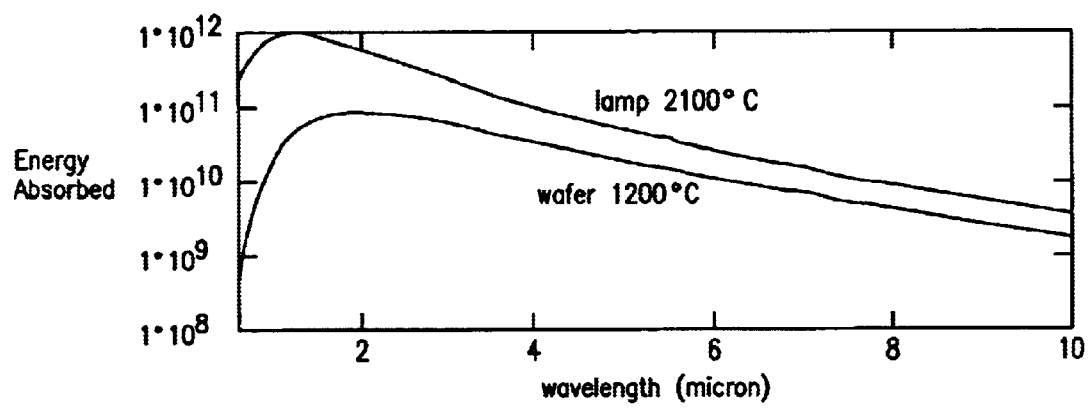
FIG. 1 shows black body emission at 1200 and 2100° C.

A "chamber" is any type of apparatus that may be used in the methods of the invention that is useful in processing a workpiece. Chambers of various configurations may be used in the invention including, among others, horizontal flow reactors, vertical furnaces and stagnant flow reactors. Quartz is currently the material of choice for chamber walls because quartz is to a large extent transparent to the heat energy provided by the lamps. As used herein, "quartz" takes its usual meaning in the art. Quartz useful in this invention may include certain impurities, including Al, As, B, Ca, Cd, Cr, Cu, Fe, K, Li, Mg, Mn, Na, Ni, P, Sb, Ti, Zr and OH. Quartz reaction chambers are described in U.S. Pat. Nos. 5,097,890, 4,579,080, 4,653,428, 4,760,244 and 5,194,401, for example. Although chambers are typically described herein as having quartz walls, any material that is suitable for the desired deposition process and amenable to the modifications described herein is intended to be included within the invention described herein.

"Selected regions" of the chamber are those regions of the chamber that experience increased coating during deposition than other regions of the chamber, or those regions that cause a non-uniform energy distribution on the workpiece. Selected regions comprise less than the entire chamber.

"Temperature" means a selected desired range of temperatures, and may be selected to include as narrow or wide range as desired.

There may be one or more selected regions in a reaction chamber where the temperature is different or the wavelength transmitted is different than other regions. These selected regions are modified by the methods described herein including one or more of altering the wall composition, changing the thickness of the walls, applying a coating of a material that absorbs a different amount of energy than the material that makes up the walls, or positioning a radiation source, reflector or absorbing material near the selected region. The selected regions in the reaction chamber may all have the same degree and type of modification, or different selected regions in a chamber may have different modifications.

The temperature of the walls of a reaction chamber and the absorption characteristics of the walls of a reaction chamber are affected by any external heating or cooling applied, the chemical composition and thickness of the chamber and any coatings on the chamber.

This invention provides methods to locally modify the temperature of a selected area of a reaction chamber to decrease hot or cold spots. Regions of the chamber that are hotter or colder than other regions can be determined through measurement of the temperature of the chamber or by observing an increased deposition in a portion of the chamber. Once the hot or cold spots are determined, various methods herein can be applied to compensate. External or internal compensating means or modifications of the chamber may be used.

For example, the composition of portions of the walls in the chamber may be modified. If a hot spot is discovered, the concentration of hydroxyl groups in the region can be decreased by making the quartz thinner in the hot spot, for example. If a cold spot is discovered, the concentration of hydroxyl groups in the region can be increased by increasing the thickness of the quartz in the cold spot or the cold spot may be coated with a material that absorbs a different amount of energy than the chamber wall. Also, radiation sources, reflectors or energy absorbing materials may be positioned near the cold spot to compensate for the temperature difference in the walls. "Near" or "adjacent" means close enough to the chamber wall to cause the desired effect. In addition, a chamber can be designed and manufactured with selected regions in areas of the chamber that are known to be hotter or colder than other regions (or absorb more or less energy than other regions). For example, in a RTP system, if the lamp output is known to have an area where the energy output is lower than other areas, the chamber can be modified to compensate by providing a modification region to correspond to the area with decreased lamp output. This will provide a more uniform energy distribution at the wafer.

Quartz is generally transparent for short wavelengths of light (lower than about 2500 nm) but absorbs varying amounts of light of longer wavelengths. OH bonds absorb light between 2.6 and 2.8 microns. The wavelengths absorbed by quartz can be altered by changing the concentration of hydroxyl groups present in the quartz or changing the thickness of quartz. A higher level of hydroxyl groups results in quartz that absorbs more light in the longer wavelength range (higher than about 2500 nm). A lower level of hydroxyl groups results in quartz that absorbs less light in the longer wavelength range.

FIG. 1 shows the absorption spectrum of a tungsten lamp (at 2100° C.) and the spectrum of a wafer having a temperature of 1200° C. The spectrum is calculated using the following equation derived from Planck's law:

$$\text{Energy} = \frac{\varepsilon c_1}{\lambda^5 \left[\exp\left[\frac{c_2}{\lambda T}\right] - 1\right]}$$

where $\varepsilon$ is the molar absorptivity and is assumed to be 1; $c_1$ is a radiation constant and is assumed to be $3.741 \times 10^{-16}$; $c_2$ is a radiation constant and is assumed to be $1.439 \times 10^{-2}$; T is the temperature (K) and $\lambda$ is the wavelength (microns).

Figure 2:
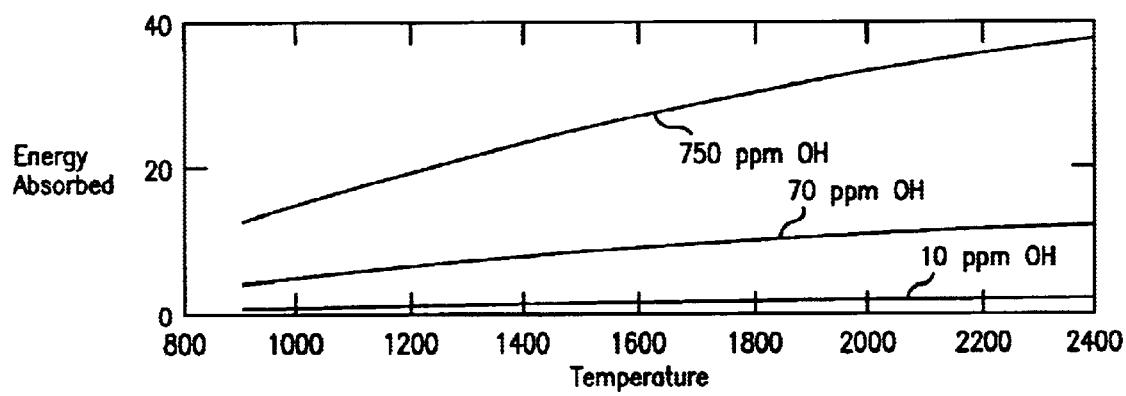
FIG. 2 shows the absorption of quartz as a function of temperature for hydroxyl group concentrations of 10 ppm, 70 ppm and 750 ppm.

FIG. 2 shows the amount of energy absorbed as a function of temperature for hydroxyl group concentrations of 10, 70 and 750 ppm. For any given temperature, increasing the concentration of hydroxyl groups increases the energy absorbed.

The absorbance of quartz as a function of hydroxyl group concentration is given by the following equation:

$$A = 1 - \exp\left(\frac{-5[OH(ppm)]}{910}\right)$$

Figure 3:
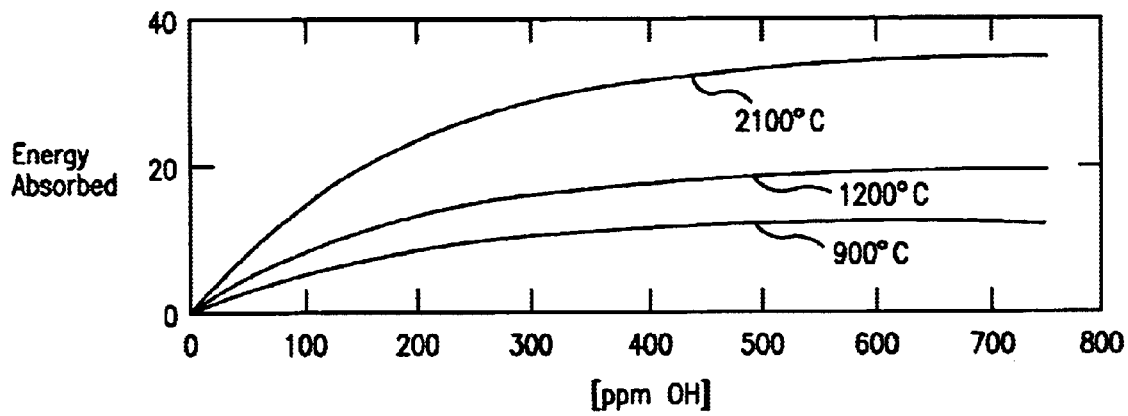
FIG. 3 shows the absorption of quartz as a function of hydroxyl group concentration at temperatures of 900, 1200 and 2100° C.

FIG. 3 shows the amount of energy absorbed by the quartz as a function of hydroxyl group concentration for three different temperatures (2100°, 1200° and 900° C.). As the hydroxyl group concentration increases from 0 ppm to 500 ppm, the energy absorbed by the quartz increases about 30–35% for an object at 2100° C.

The thickness of the quartz also affects the absorption characteristics of the chamber. In general, thicker quartz absorbs more energy than thinner quartz. The transmission of quartz is related to the thickness of quartz by the following relationship:

$$T = (1-r)^2 e^{-at}$$

where T is the percent transmission expressed as a decimal; r is the surface reflection loss for one surface; a is the absorption coefficient (cm$^{-1}$); and t is the thickness in cm ("Optical Properties" General Electric product brochure).

Figure 4:
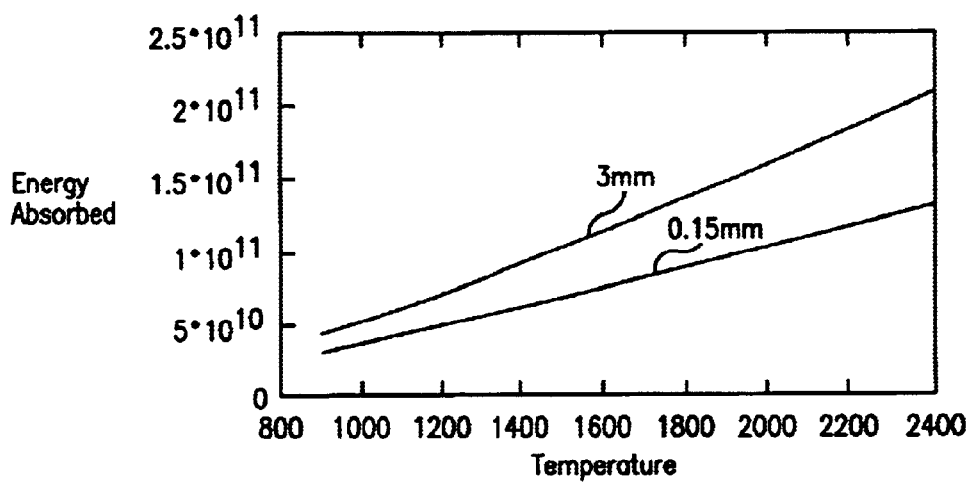
FIG. 4 shows the absorption of quartz due to thickness variations as a function of temperature.

FIG. 4 shows the difference in the amount of energy absorbed by 3 mm quartz and 0.15 mm quartz as a function of temperature. Generally, quartz is transparent for light within a range (band) of wavelengths. This band is a function of the quartz thickness. When the thickness of quartz increases from 0.15 mm to 3 mm, 58% more energy at the temperature of a representative lamp is absorbed. Quartz that is 0.15 mm thick absorbs light greater than 4.8 microns. Quartz with a thickness of 3 mm absorbs light greater than 4 microns, and transmits light less than 4 microns.

The above relationships and descriptions show that by changing the hydroxyl group concentration or thickness of quartz, it is possible to tailor the quartz to absorb or transmit certain wavelengths or ranges of wavelengths, or absorb energy of a certain magnitude, or to prepare a material with a selected temperature.

Modifications in the hydroxyl group concentration or thickness of the material are performed in localized areas of the chamber to decrease the amount of coating in areas that undergo a higher coating than other areas.

The modifications to the thickness and hydroxyl concentration of the quartz described by this invention may be performed by any means known in the art, including welding pieces of quartz together using the fillet welding technique (using a rod to join the pieces) melting the surfaces and pushing them together before cooling and glueing (using a glass type with a lower melting temperature than quartz, such as Corning Glass 7070). Also, pieces of quartz with different hydroxide contents may be attached to each other by any means known in the art to form the quartz reaction chamber of the invention. Alternatively, portions of quartz in selected areas may be ground away. These modifications may be performed individually, or in combination.

Hydroxy-modified quartz may be made by flame fusing or electrically fusing. Low OH quartz (quartz with less than 70 ppm OH) is typically electrically fused, while high OH quartz (quartz with more than 70 ppm) is typically flame fused.

Alternatively, or in combination, applying a coating of a material that absorbs energy incident on the chamber or radiated from the chamber also alters the energy and wavelengths absorbed. Examples of coatings are silicon, germanium and titanium oxide. These materials and others will absorb a portion of the light depending on the thickness of the coating. Desired portions of the reaction chamber may be coated using methods known in the art, including masking portions of the reaction chamber that are not desired to be coated.

Alternatively, or in combination, a radiation source that emits a wavelength or wavelengths absorbed by the walls may be placed adjacent to selected regions of the chamber to cause selected regions of the chamber to be heated to a greater extent than other regions of the chamber. This radiation source may be in combination with other radiation sources designed to have light incident on the entire chamber. A preferred embodiment of this aspect of the invention is the use of a radiation source that emits wavelengths greater than about 5 microns in combination with a quartz reactor. In this range, the energy is only absorbed by the quartz and only influences the temperature of the quartz. Alternatively, or in combination, a reflector may be positioned near selected regions of the chamber to reflect heat emitted from the chamber back onto selected regions of the chamber. Alternatively, or in combination, an absorbing material may be positioned near selected regions of the chamber to absorb and reradiate energy to selected regions of the chamber. A preferred embodiment of this aspect of the invention is the use of an absorbing material outside the chamber. An absorbing material is a material that absorbs energy impinging on it and reradiates it. Such materials are known to the art.

The reaction chambers of the invention may be put to a variety of uses. Preferably, the reaction chambers are used as reaction chambers for semiconductor processing reactions. There are a variety of types of processing reactions known in the art, including chemical vapor deposition (CVD), rapid thermal processing chemical vapor deposition (RTPCVD), low pressure chemical vapor deposition (LPCVD), molecular beam epitaxy (MBE), reactive ion sputtering (RIS), physical vapor deposition (PVD) and plasma processing. The quartz reaction chambers may be used in any of these methods, or others, as known in the art.

The methods and reaction chambers of the invention may be used in conjunction with other methods of controlling the temperature around a reaction chamber, for example heating or cooling fluid or gas flowing around a reaction chamber.

In a preferred embodiment, the invention can be used in a chemical vapor deposition (CVD) process to decrease the amount of chemical deposition on the walls of the quartz reaction chamber by keeping the temperature of the walls of the reaction chamber within a desired range. The invention is particularly useful for decreasing the amount of chemical deposition in high deposition areas.

The invention is also useful in the rapid thermal processing (RTP) process to alter the temperature of the wafer. The invention may be used to prevent local temperature differences on the wafers to achieve a more uniform coating during processing, or produce local temperature differences on the wafers if desired.

The invention may be used to prevent instrument reading errors in the chamber. For example, the temperature of the chamber may be monitored using a pyrometer which is connected to the chamber through a window. Coating of the pyrometer window with a small amount of material may affect the temperature reading considerably. An incorrect temperature reading may decrease throughput. By using the methods of the invention to prevent coating of material at the pyrometer window, more accurate temperature readings can be obtained.

Also, the wavelength or energy transmitted through the chamber may be tailored for a specific use. For example, a specific wavelength may be useful for initiating a reaction on the wafer and other wavelengths may initiate undesirable side reactions. Alternatively, a specific energy may be desired to initiate a specific reaction, and a higher energy may produce undesirable decomposition reactions. By producing a reaction chamber that is tailored to transmit the desired wavelength range or energy level, the chamber will be optimized for certain uses.

The methods of the invention can also be used to form a predetermined pattern of material deposited on a substrate. In one embodiment, the thickness of quartz in a reaction chamber is altered to form a gradient of thickness above the wafer in a RTP apparatus. Heat is applied to the reaction chamber, and a temperature gradient on the wafer is formed due to the variation in thickness of the quartz. The temperature gradient results in differences in the thickness and composition of the material deposited on the wafer that may be reproducibly formed.

Some advantages of the present invention include reducing the amount of coating on the chamber from condensation or deposition on the chamber, reducing the etch time of semiconductor processing reactions, which in turn, increases the throughput of the reactor; reducing the temperature gradients on wafers during depositions, which results in a more uniform product; and increasing the accuracy of temperature readings of the wafer or reaction chamber.

Figure 5:
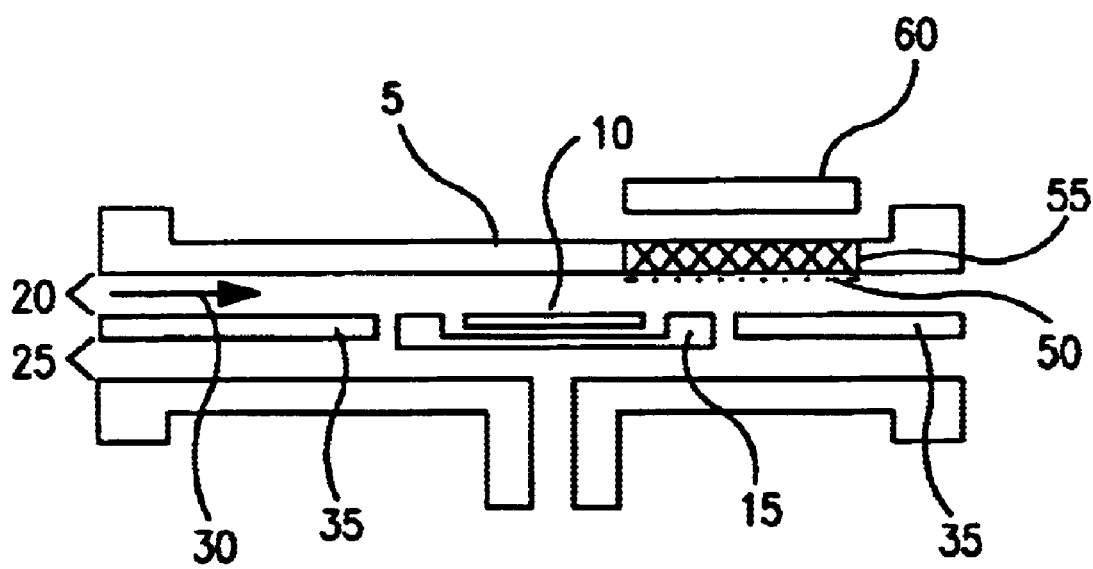
FIG. 5 shows modification of a portion of a horizontal flow reactor to reduce chamber deposition.

FIGS. 5–10 show particular exemplary applications of the invention. In the Figures, like numbers indicate like features. FIG. 5 shows the use of the invention in a horizontal flow reactor. Reactor 5 has upper portion 20 and lower portion 25. Spacers 35 separate upper portion 20 and lower portion 25. Workpiece 10 (e.g., substrate or wafer) is positioned on susceptor 15. Gas flow 30 flows over workpiece 10. In FIG. 5, unwanted chamber coating 50 is formed in the location shown. Unwanted chamber coating 50 is compensated for by adjustment of the chamber, shown as 55. This adjustment may comprise altering the thickness of the quartz or the hydroxyl group concentration at that location, or applying a coating of a material that absorbs more energy than the walls in nonselected locations. The coating can be applied to the inside or outside of the chamber, or both. If the coating is applied to the inside of the chamber, it must be able to withstand the chemical environment of the deposition process used in the chamber. For example, during the epitaxy process, relatively harsh chemicals are present, while relative milder chemicals are present during rapid thermal anneals. Additionally or alternatively, the unwanted coating may be reduced by the use of one or more of a radiation source, reflector or absorbing material, shown in FIG. 5 as 60, near unwanted chamber coating 50.

Figure 6:
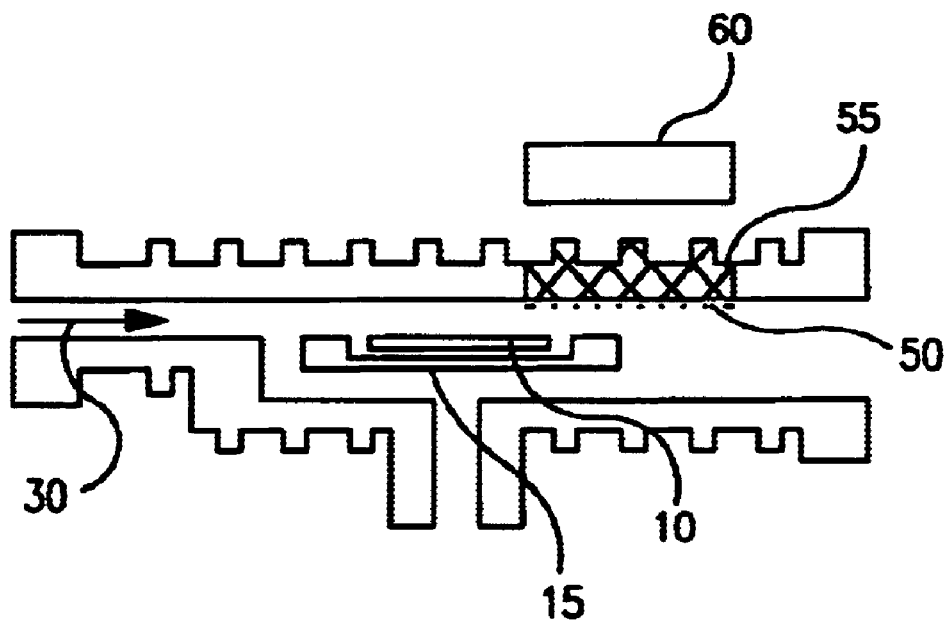
FIG. 6 shows modification of a portion of a different type of horizontal flow reactor to reduce chamber deposition.
Figure 7:
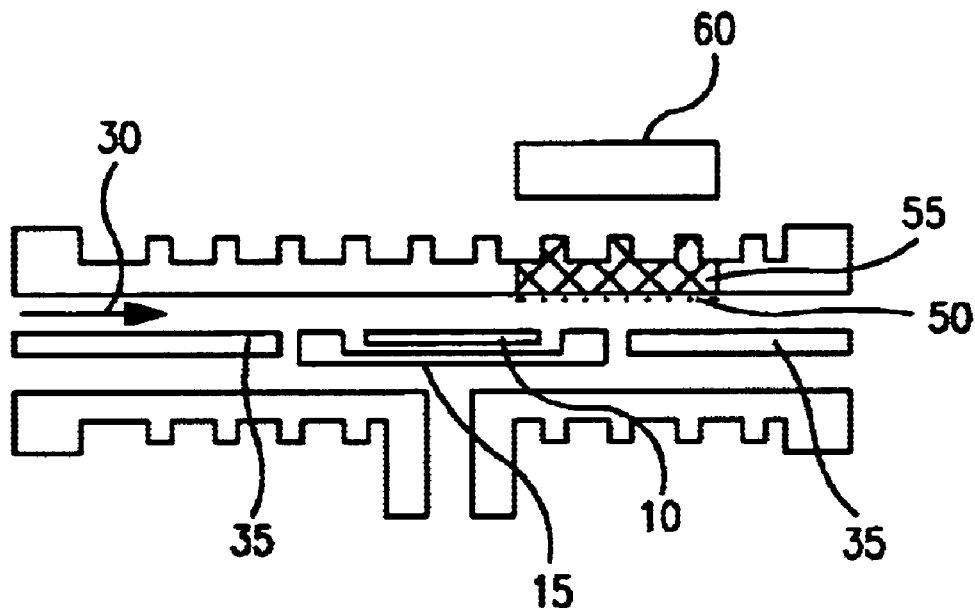
FIG. 7 shows modification of a portion of a different type of horizontal flow reactor to reduce chamber deposition.

FIGS. 6 and 7 show the use of the invention in other configurations of the horizontal flow reactor. The thickness variation of the quartz walls in FIGS. 6 and 7 cause temperature variations. When the thickness of the quartz is increased the temperature will increase since more light will be absorbed, and vice versa.

Figure 8:
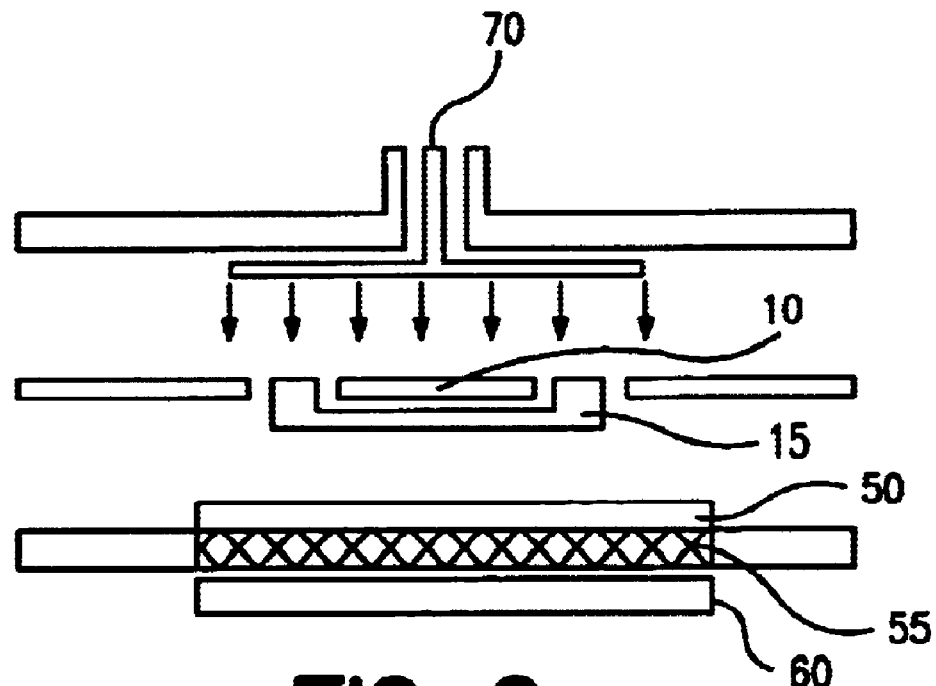
FIG. 8 shows modification of a portion of a shower head type reactor to reduce chamber deposition.

FIG. 8 shows the use of the invention in a shower head type reactor. Reactant gas flows through shower head 70. Unwanted chamber deposition 50 is compensated for by adjustment 55 in the walls. Alternatively or additionally, adjustment 60 which is a radiation source, reflector or absorbing material may be used.

Figure 9:
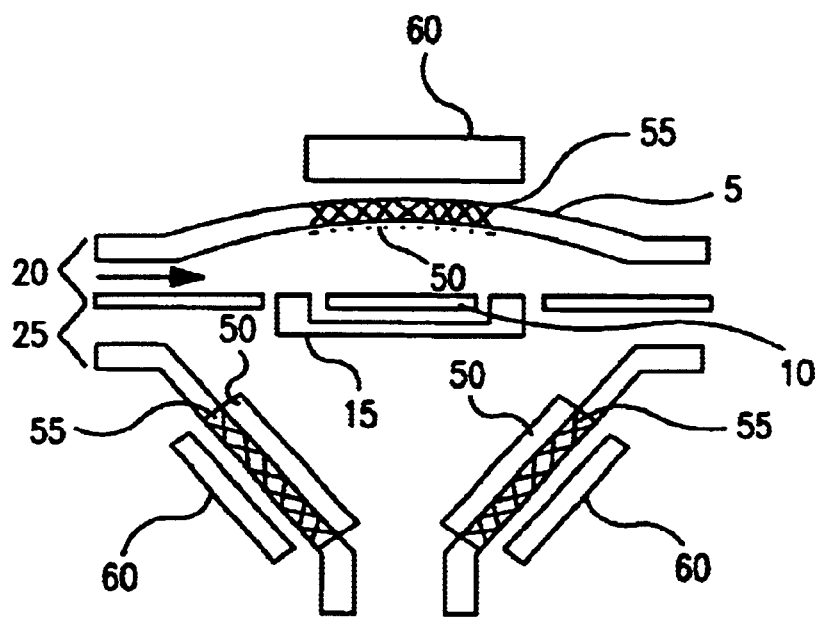
FIG. 9 shows modification of portions of another configuration of reactor to reduce chamber deposition.

FIG. 9 shows the modification in chamber that experiences unwanted chamber coating in the bottom portion of the chamber as well as the top portion of the chamber. Chamber 5 has an upper portion 20 and a lower portion 25. Wafer 10 is positioned on susceptor 15. During operation, unwanted chamber coating 50 is formed in various places in the chamber. The chamber is adjusted in areas 55 to reduce the unwanted chamber deposition. Alternatively or additionally, adjustment 60 may be used.

Figure 10:
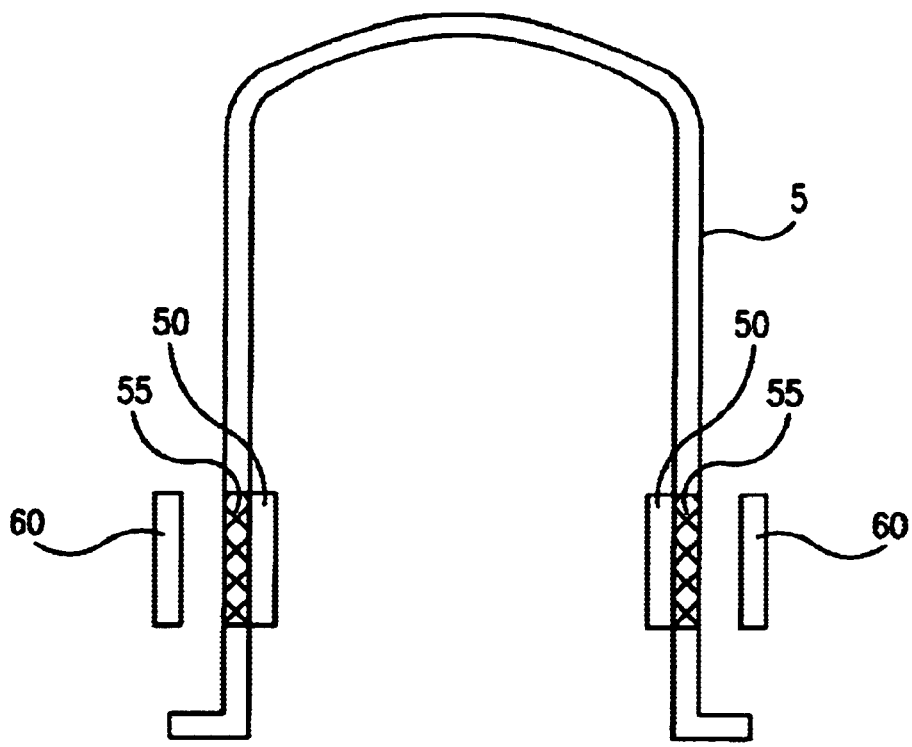
FIG. 10 shows modification of a vertical oven tube reactor to reduce chamber deposition.

FIG. 10 shows modification of the chamber in a vertical oven tube reactor. Unwanted coating 50 on chamber 5 is reduced by modification 55. Modification 55 may be altering the thickness or hydroxyl concentration of the quartz in that region, or may be the use of a radiation source, reflector or absorbing material near area 55. Alternatively or additionally, adjustment 60 may be used.

Although the description above contains many specificities, these should not be construed as limiting the scope of the invention but as merely providing illustrations of some of the presently-preferred embodiments of this invention. Those of ordinary skill in the art will recognize that structures, conditions, procedures and materials other than those specifically described herein can be employed in the practice of this invention without expense of undue experimentation. All known functional equivalents of the structures, conditions, procedures and materials specifically disclosed herein are intended to be encompassed by this invention. All references cited herein are hereby incorporated by reference in their entirety to the extent that they are not inconsistent with the disclosure herewith.

I claim:

1. An apparatus for processing substrates comprising a chamber having walls, said walls having one or more regions having hot or cold spots, wherein said one or more regions having hot or cold spots is coated with a material that causes said one or more regions having hot or cold spots to absorb a different amount of energy than other parts of said walls, whereby said chamber has reduced deposition of by-products from processing.

2. An apparatus for processing substrates comprising a chamber having walls, said walls having one or more regions having cold spots, wherein one or more energy absorbing elements are positioned outside said chamber near said one or more regions having cold spots of said walls, whereby said chamber has reduced deposition of by-products from processing.

3. The apparatus of claim 1, wherein said energy absorbing elements are made of material which is a better absorber of energy than the walls of said chamber.

4. A method of minimizing deposition on the walls of a reaction chamber, comprising the step of altering the temperature of one or more regions having a hot or cold spots, wherein said altering step comprises coating the one or more regions having a hot or cold spots of said walls with a material that absorbs a different amount of energy than other parts of said walls, whereby deposition on said walls during processing of substrates is minimized.

5. A method of minimizing deposition on the walls of a reaction chamber, comprising the step of altering the temperature of one or more regions having cold spots, wherein said altering step comprises positioning one or more energy absorbing elements outside said walls near said regions having cold spots of said walls, whereby deposition on said walls during processing of substrates is minimized.

6. A method of making an apparatus comprising the steps of: supplying walls with one or more regions having hot or cold spots, said walls transparent to at least one desired wavelength; and coating the inside of said walls with a material wherein the desired wavelength is not transmitted.

7. An apparatus for processing substrates comprising a chamber having walls having one or more regions having hot or cold spots, and one or more energy absorbing elements positioned outside said chamber adjacent to one or more regions having hot or cold spots of said chamber walls to reduce deposition on said chamber walls.

8. The apparatus of claim 7, wherein said elements are made of material which is a better heat absorber than the walls of said chamber.

9. A method of reducing deposition on the interior wall of a quartz chamber comprising positioning one or more energy absorbing elements outside the chamber adjacent to regions having one or more cold spots.

10. The method of claim 9, wherein said energy absorbing elements are made of material which is a better heat absorber than the wall of said chamber.

* * * * *